(12) United States Patent
Putynkowski et al.

(10) Patent No.: US 10,868,419 B2
(45) Date of Patent: Dec. 15, 2020

(54) SAFETY SHUTOFF SYSTEM FOR PHOTOVOLTAIC MODULES

(71) Applicants: CENTRUM BADAN I ROZWOJU TECHNOLOGII DLA PRZEMYSLU S.A., Warsaw (PL); HANPLAST SP. Z O.O., Bydgoszcz (PL)

(72) Inventors: Grzegorz Putynkowski, Warsaw (PL); Wojciech Andrysiewicz, Cracow (PL); Pawel Balawender, Cracow (PL); Krzysztof Wozny, Makow Podhalanski (PL); Aleksander Majchrowicz, Niemcz (PL)

(73) Assignees: CENTRUM BADAN I ROZWOJU TECHNOLOGII DLA PRZEMYSLU S.A., Warsaw (PL); HANPLAST SP. Z O.O., Bydgoszcz (PL)

(*) Notice: Subject to any disclaimer, the term of this patent is extended or adjusted under 35 U.S.C. 154(b) by 155 days.

(21) Appl. No.: 16/290,908

(22) Filed: Mar. 3, 2019

(65) Prior Publication Data

US 2019/0273375 A1    Sep. 5, 2019

(30) Foreign Application Priority Data

Mar. 2, 2018    (EP) .................................... 18461525

(51) Int. Cl.
*H02H 7/20* (2006.01)
*H02H 9/00* (2006.01)
(Continued)

(52) U.S. Cl.
CPC ......... *H02H 7/20* (2013.01); *H01L 31/02021* (2013.01); *H02H 9/00* (2013.01);
(Continued)

(58) Field of Classification Search
CPC . H02H 7/122; H02H 7/20; H02H 9/00; H02S 50/00; H01L 31/02021
See application file for complete search history.

(56) References Cited

FOREIGN PATENT DOCUMENTS

| EP | 2398123 A2 * | 12/2011 | ............. H04B 3/548 |
|----|-------------|---------|-------------------------|
| EP | 2621045 | 7/2013 | |

(Continued)

OTHER PUBLICATIONS

Translation of EP 2398123A2. Dec. 21, 2011. (Year: 2011).*

*Primary Examiner* — Jared Fureman
*Assistant Examiner* — Christopher J Clark
(74) *Attorney, Agent, or Firm* — Mark M. Friedman

(57) ABSTRACT

A safety shutoff system for protecting a photovoltaic system. The safety shutoff system includes a control signal generator and a switching modules. The control signal generator includes an oscillator for generating a time-varying control signal and a DC-signal separator for transmitting the time-varying control signal via a DC power line. Each switching module includes a DC-signal separator for receiving the time-varying control signal; a rectifier and power storage block configured to store power of the control signal and to supply the stored power to other components of the switching module; a control signal detector for determining a presence of the time-varying control signal; and a switch connectable between terminals of the PV module, wherein the switch is a normally-open switch. The control signal detector, when powered by the power storage block, is configured to close the switch upon detecting an absence of the time-varying control signal.

6 Claims, 2 Drawing Sheets

(51) Int. Cl.
*H01L 31/02* (2006.01)
*H02S 50/00* (2014.01)
H02S 50/10 (2014.01)
H02H 1/00 (2006.01)
H02H 3/16 (2006.01)

(52) U.S. Cl.
CPC ........... *H02S 50/00* (2013.01); *H02H 1/0015* (2013.01); *H02H 3/16* (2013.01); *H02S 50/10* (2014.12)

(56) References Cited

FOREIGN PATENT DOCUMENTS

| | | |
|---|---|---|
| EP | 2778703 | 9/2014 |
| WO | 2010078303 | 7/2010 |
| WO | 2012166946 | 12/2012 |

* cited by examiner

SAFETY SHUTOFF SYSTEM FOR PHOTOVOLTAIC MODULES

TECHNICAL FIELD

The present invention relates to safety shutoff systems for photovoltaic modules.

BACKGROUND

Photovoltaic modules (PV modules) with photovoltaic cells can be aggregated to form solar farms for generating large amounts of electricity from sunlight. The PV modules can be arranged in series to form strings, which can be connected in parallel to form a PV field. The DC energy produced by one or more strings is converted by an inverter to alternating current (AC) which is supplied to utility grid. High voltages generated by the PV modules pose certain security hazards, including fire risk hazards.

SUMMARY OF THE INVENTION

There are known various configurations of safety shutoff systems for photovoltaic modules, but there is a need to provide an alternative safety shutoff system to improve drawbacks of the known systems.

The present invention is related to a safety shutoff system for protecting a photovoltaic system, wherein the photovoltaic system comprises an inverter connected via a DC power line to a plurality of photovoltaic modules connected in series. The safety shutoff system comprises a control signal generator and a plurality of switching modules. The control signal generator comprises: an oscillator for generating a time-varying control signal; and a DC-signal separator for transmitting the time-varying control signal via the DC power line. The DC-signal separator provides a low impedance path for DC current generated by the PV modules between the series of the PV modules and the inverter and a low impedance path for the time-varying control signal between the control signal generator and the series of the PV modules. Each switching module is configured to be connected between a dedicated PV module and the DC power line and comprises: a DC-signal separator for receiving the time-varying control signal from the DC power line; a rectifier and power storage block configured to store power of the control signal and to supply the stored power to other components of the switching module; a control signal detector for determining a presence of the time-varying control signal; and a switch connectable between terminals of the PV module, wherein the switch is a normally-open switch. The control signal detector, when powered by the power storage block, is configured to close the switch upon detecting an absence of the time-varying control signal.

The switch of at least one of the switching modules may be a MOSFET transistor.

The switch of at least one of the switching modules may be a relay switch.

At least one of the switching modules may comprise a plurality of switches, each connected to a dedicated PV module.

The control signal generator may further comprise an oscillator controller configured to deactivate the oscillator.

The time-varying control signal may have a frequency between 2 kHz and 900 kHz.

These and other features, aspects and advantages of the invention will become better understood with reference to the following drawings, descriptions and claims.

BRIEF DESCRIPTION OF DRAWINGS

The invention is shown by means of example embodiment in a drawing, wherein.

DETAILED DESCRIPTION

The following detailed description is of the best currently contemplated modes of carrying out the invention. The description is not to be taken in a limiting sense, but is made merely for the purpose of illustrating the general principles of the invention.

Figure 1:
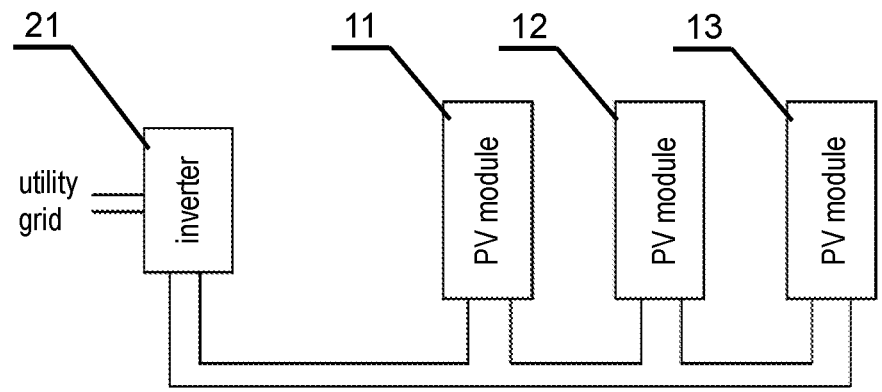
FIG. 1 shows schematically a PV system.

The PV system for which the safety shutoff system presented herein is applicable, is shown in FIG. 1. It comprises a plurality of PV modules 11-13 connected in series via a DC power line with each other and with an inverter 21, which is connected with a utility grid. The inverter 21 converts the DC power output by the PV modules 11-13 to AC.

Figure 2:
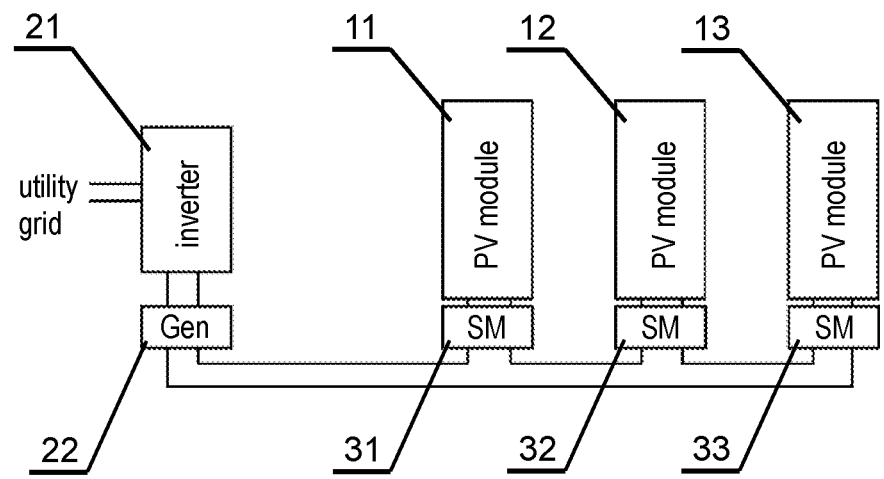
FIG. 2 shows schematically the PV system with the safety shutoff system implemented.

FIG. 2 shows schematically the PV system with the safety shutoff system implemented. The inverter is connected to a generator 22, which is connected with a set of switching modules 31-33 connected in series, each switching modules 31-33 being connected to one of the PV modules 11-13.

Figure 3:
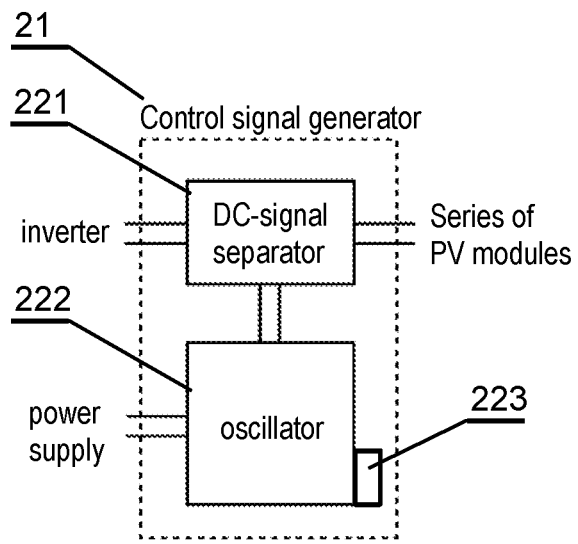
FIG. 3 shows schematically the structure of a control signal generator.

FIG. 3 shows the structure of the generator 22. It comprises a DC-signal separator 221 for separating the control signal from the DC power generated by the PV modules. The separator 221 provides a low impedance path for DC current generated by the PV modules between the series of the PV modules 11-13 and the inverter 21, and at the same time provides a low impedance path for the signal generated by the generator between the generator 22 and the series of the PV modules 11-13. The control signal is generated by an oscillator 222 or any other circuit suitable for generating a time-varying control signal, e.g. having a sinusoidal or square form. The control signal may have a frequency from a few kHz to a few hundred kHz, preferably from 2 kHz to 900 kHz. It can have constant, non-modulated parameters. The generator 22 may further comprise an oscillator controller 223 configured to deactivate the oscillator 222. For example, the oscillator controller 223 may be a manual switch, a remote controller (such as an alarm system, wireless controller etc.). Alternatively, the oscillator 222 may be deactivated simply turning off its power supply. The generator 22 can be provided in a dedicated housing, to be mounted at the inverter.

Figure 4:
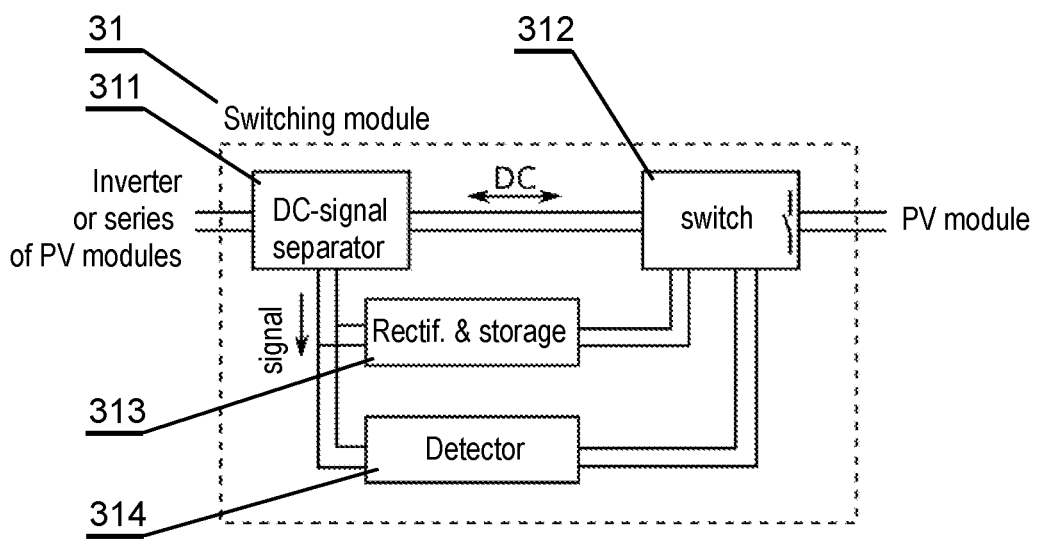
FIG. 4 shows schematically the structure of a switching module.

FIG. 4 shows the structure of the switching modules 31-33. The switching module 31 comprises a DC-signal separator 311 for separating the control signal from the DC power generated by the PV module 11 to which the switching module 31 is connected. The signal received by the switching module 31 from the generator 22 is input to:

a rectifier and power storage block 313, which provides power to operate the other elements of the switching module 31; thereby, the switching module 31-33 does not need external power supply to operate; and a signal detector 314 configured to detect the presence of the control signal or a lack of the control signal.

A switch 312 is connected between the output terminals of the PV module. The switch 312 is normally open, unless it received a signal configuring it to a closed configuration. When the switching modules are energized by the control signal, the rectifier 313 powers the detector 314. The detector, upon detecting a presence of the control signal, does not alter the open configuration of the switch 312, so that the DC power is passed from the PV module 11 to the DC-signal separator 311. However, if the detector 314 does not detect the control signal, the detector 314 configures the switch 312 to short-circuit the output terminals of the PV module. The switch 312 can be kept in the short-circuited state as long as the power storage block 313 provides power to keep the switch closed and to keep the PV module in a potential-free state as long as the control signal is not present.

In one embodiment, the switch 312 can be implemented using a MOSFET transistor. In that case, the parasitic diode of the MOSFET transistor may be used in place of shunting diodes typically installed within the connector of the PV module.

In another embodiment, the switch 312 can be implemented as a relay switch.

The switching module 31 can be provided in a dedicated housing to be mounted at the PV module and connected to the PV module via dedicated wires. Alternatively, the switching module 31 can be provided as an electronic circuit to be integrated with the PV junction box or PV module connector.

Alternatively, a single switching module 31 can be provided with a plurality of switches, each for controlling a dedicated PV module.

The DC-signal separators 221, 311 may comprise filters to separate DC and AC signals. An inductor can be used as a filter allowing for DC current to pass, but blocking AC current. A capacitor can be used as a filter blocking DC current and allowing AC current to pass. Therefore a DC device (in this case inverter or PV module) can be connected via an inductor to a common wire, while an AC device (in this case the signal generator or safety module) can be connected via capacitor to the same wire. Thus the wire carries both the DC and AC components, while the separator splits them at either end of the cable. Other known means to couple DC and AC signals may use transformers or other components. Also, the filter elements mentioned do not have to be explicit components, but may parasitic or intrinsic to the PV system (e.g. wire inductance, PV cell junction/ diffusion capacitance). There are also active filtering components (i.e. utilizing electrical amplifiers), that may be applicable instead of passive components such as capacitors, inductors or transformers.

To summarize, the system operates as follows. In the initial state, the switching modules 31-33 have no stored energy and therefore are not active, i.e. the switches of the switching modules are set to their default open state and the PV module operates normally and delivers power at its output terminals. When the generator 22 is connected into the system, it generates the control signal. The control signal is transmitted via the electrical wires between the generator 22 and the switching modules 31-33 and causes the accumulation of electrical energy in the built-in power storage blocks 313 of the switching modules 31-33. As long as the control signal is generated, the switches 312 are open and the PV modules operate normally to deliver power. When the control signal is disrupted (e.g. due to malfunction of the generator or the break of the wires of the installation or to manual or remote switching off), the switches 312 are closed and the PV modules are short-circuited to prevent power to be delivered to the installation.

The system presented herein is particularly applicable as anti-shock protection in case of fire hazards, due to its normally-closed configuration (i.e. the PV module is short-circuited in absence of the control signal). Furthermore, it can be used to controllably switch off the PV field. The switching modules operate as diode bridges for the PV modules. It can be easily implemented into existing PV systems and does not require additional complicated wiring infrastructure. The switching modules do not require external power to operate. The system has a simple structure and does not require programmable controllers to operate. All elements are controlled in analogue manner.

While the invention presented herein has been depicted, described, and has been defined with reference to particular preferred embodiments, such references and examples of implementation in the foregoing specification do not imply any limitation on the invention. It will, however, be evident that various modifications and changes may be made thereto without departing from the broader scope of the technical concept. The presented preferred embodiments are exemplary only, and are not exhaustive of the scope of the technical concept presented herein.

Accordingly, the scope of protection is not limited to the preferred embodiments described in the specification, but is only limited by the claims that follow.

What is claimed is:

1. A safety shutoff system for protecting a photovoltaic system, wherein the photovoltaic system comprises an inverter connected via a DC power line to a plurality of photovoltaic modules connected in series; wherein the safety shutoff system comprises:
   a control signal generator comprising:
      an oscillator for generating a time-varying control signal; and
      a DC-signal separator for transmitting the time-varying control signal via the DC power line;
      wherein the DC-signal separator provides a low impedance path for DC current generated by the PV modules between the series of the PV modules and the inverter and a low impedance path for the time-varying control signal between the control signal generator and the series of the PV modules;
   a plurality of switching modules, each configured to be connected between a dedicated PV module and the DC power line and comprising:
      a DC-signal separator for receiving the time-varying control signal from the DC power line;
      a rectifier and power storage block configured to store power of the control signal and to supply the stored power to other components of the switching module;
      a control signal detector for determining a presence of the time-varying control signal; and
      a switch connectable between terminals of the PV module, wherein the switch is a normally-open switch;
      wherein the control signal detector, when powered by the power storage block, is configured to close the switch upon detecting an absence of the time-varying control signal.

2. The safety system of claim 1, wherein the switch of at least one of the switching modules is a MOSFET transistor.

3. The safety system of claim 1, wherein the switch of at least one of the switching modules is a relay switch.

4. The safety system of claim 1, wherein at least one of the switching modules comprises a plurality of switches, each connected to a dedicated PV module.

5. The safety system of claim 1, wherein the control signal generator further comprises an oscillator controller configured to deactivate the oscillator.

6. The safety system of claim 1, wherein the time-varying control signal has a frequency between 2 kHz and 900 kHz.

* * * * *